(12) United States Patent
Kim et al.

(10) Patent No.: US 11,620,961 B2
(45) Date of Patent: Apr. 4, 2023

(54) DISPLAY APPARATUS COMPRISING BUMP

(71) Applicant: LG Display Co., Ltd., Seoul (KR)

(72) Inventors: SangHo Kim, Paju-si (KR); YoungJoo Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 17/728,669

(22) Filed: Apr. 25, 2022

(65) Prior Publication Data
US 2022/0358889 A1  Nov. 10, 2022

(30) Foreign Application Priority Data
May 6, 2021  (KR) .......................... 10-2021-0058676

(51) Int. Cl.
| | |
|---|---|
| *G02F 1/1339* | (2006.01) |
| *G09G 3/36* | (2006.01) |
| *H01L 27/12* | (2006.01) |
| *G02F 1/1362* | (2006.01) |
| *G02F 1/1368* | (2006.01) |
| *G02F 1/1343* | (2006.01) |
| *G02F 1/1335* | (2006.01) |

(52) U.S. Cl.
CPC .......... *G09G 3/3614* (2013.01); *G02F 1/1339* (2013.01); *G02F 1/1368* (2013.01); *G02F 1/133512* (2013.01); *G02F 1/134309* (2013.01); *G02F 1/136286* (2013.01); *H01L 27/124* (2013.01); *G09G 2300/0842* (2013.01); *G09G 2320/0247* (2013.01)

(58) Field of Classification Search
CPC .......... G09G 3/3614; G09G 2300/0842; G02F 1/1339; G02F 1/134309; G02F 1/136286; G02F 1/1368; H01L 27/124
See application file for complete search history.

(56) References Cited

FOREIGN PATENT DOCUMENTS

| | | | | |
|---|---|---|---|---|
| JP | 20180044005 A | * | 5/2018 | ......... G02F 1/13394 |
| KR | 10-2018-0025025 A | | 3/2018 | |
| KR | 10-2018-0044005 A | | 5/2018 | |

OTHER PUBLICATIONS

KR 20180044005 A translation (Year: 2018).*

* cited by examiner

*Primary Examiner* — James A Dudek
(74) *Attorney, Agent, or Firm* — Fenwick & West LLP

(57) ABSTRACT

A display apparatus comprises a plurality of data lines, a plurality of gate lines crossing at least one of the plurality of data lines, a plurality of thin film transistors electrically connected to one of the plurality of data lines and one of the plurality of gate lines, and a plurality of bumps disposed on at least some of the thin film transistors. Bumps may overlap active layers of thin film transistors that are not continuously disposed along a gate line from the plurality of gate lines and may overlap active layers of thin film transistors that are not continuously disposed along a data line from the plurality of data lines.

18 Claims, 11 Drawing Sheets

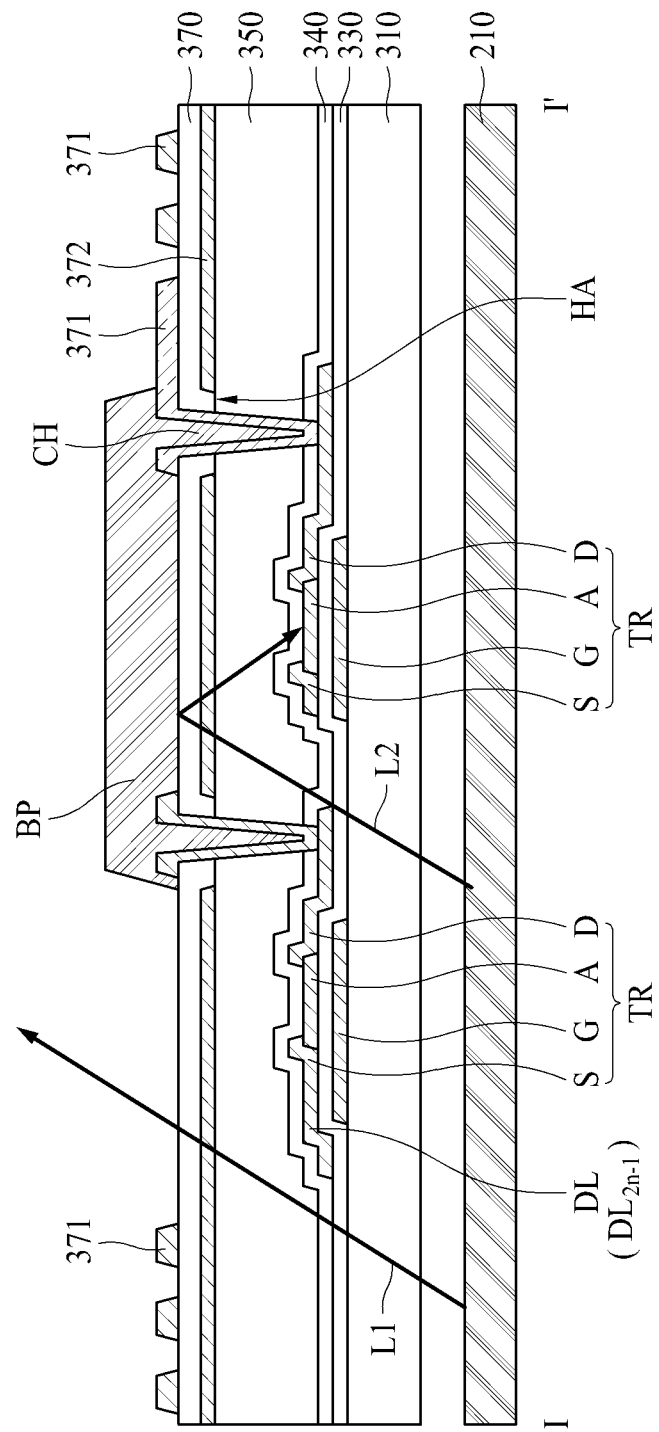

DISPLAY APPARATUS COMPRISING BUMP

CROSS-REFERENCE TO RELATED APPLICATION

This application claims the benefit of Republic of Korea Patent Application No. 10-2021-0058676 filed on May 6, 2021, which is hereby incorporated by reference in its entirety.

BACKGROUND

Field of Technology

The present disclosure relates to a display apparatus comprising a bump, and more particularly, to a display apparatus that comprises a bump disposed in a zigzag shape to prevent or at least reduce a flicker phenomenon from occurring in the display apparatus.

Discussion of the Related Art

A display apparatus for implementing various kinds of information on a screen is an apparatus in which a core technology of an information communication age is aggregated. Recently, a display apparatus has been manufactured to be thin, light, and portable, and has been developed to implement high performance. Representative examples of such a display apparatus include a liquid crystal display (LCD) and an organic light Emitting diode display (OLED).

The LCD displays an image on a liquid crystal panel by adjusting light transmittance of a liquid crystal pixel on the liquid crystal panel in accordance with a gray scale value of video data. When a direct current voltage is applied to the liquid crystal pixel arranged on the liquid crystal panel for a long time, light transmission characteristics of the liquid crystal pixel are deteriorated. This direct current fixation causes an afterimage to appear on an image displayed on the liquid crystal panel, thereby degrading quality of the image.

In order to avoid the direct current fixation, an inversion type liquid crystal display apparatus has been suggested in which a pixel data signal to be supplied to liquid crystal pixels of a liquid crystal panel is inverted based on a reference voltage, that is, a common voltage Vcom. Since the liquid crystal material is degraded when an electric field continues to be applied thereto in the same direction, a polarity of a gray scale voltage for the common voltage is inverted to drive the liquid crystal. For example, when a signal voltage of a positive (+) polarity is applied to any one pixel at any one frame, a signal voltage of a negative (−) polarity may be applied at next frame.

The inversion type may be categorized into a frame inversion, a line inversion, a column inversion, or a dot inversion, for example.

The frame inversion type inverts a voltage polarity of pixel video signals supplied to liquid crystal pixels on a liquid crystal panel every frame period. According to the frame inversion type, when a pixel data signal of a positive (+) polarity is charged in all of the liquid crystal pixels on the liquid crystal panel at an odd-numbered frame period, a pixel data signal of a negative (−) polarity may be charged in all of the liquid crystal pixels on the liquid crystal panel at an even-numbered frame period.

The line inversion type alternately inverts a polarity of a pixel data signal to be supplied to liquid crystal pixels on a liquid crystal panel in accordance with a gate line, and alternately inverts the polarity of the pixel data signal in accordance with a frame. According to the line inversion type, at an odd-numbered frame, a pixel data signal of a positive polarity may be charged in the liquid crystal pixels on the odd-numbered gate line, and a pixel data signal of a negative polarity may be charged in the liquid crystal pixels on the even-numbered gate line. Also, at an even-numbered frame, the pixel data signal of the negative polarity may be charged in the liquid crystal pixels on the odd-numbered gate line, and the pixel data signal of the positive polarity may be charged in the liquid crystal pixels on the even-numbered gate line.

The column inversion type alternately inverts a polarity of a pixel data signal to be supplied to liquid crystal pixels on a liquid crystal panel in accordance with a data line, and alternately inverts the polarity of the pixel data signal in accordance with a frame. According to the column inversion type, at an odd-numbered frame, a pixel data signal having a positive polarity is charged in the liquid crystal pixels on the odd-numbered data line, and a pixel data signal of a negative polarity may be charged in the liquid crystal pixels on the even-numbered data line. Also, at an even-numbered frame, a pixel data signal of a negative polarity may be charged in the liquid crystal pixels on the odd-numbered data line, and a pixel data signal of a positive polarity may be charged in the liquid crystal pixels on the even-numbered data line.

The dot inversion type alternately inverts a polarity of a pixel data signal supplied to liquid crystal pixels on a liquid crystal panel in accordance with a gate line and a data line, and also inverts the polarity of the pixel data signal in accordance with a frame. The dot inversion type charges each of the liquid crystal pixels with a pixel data signal having a polarity opposite to that of adjacent liquid crystal pixels. According to the dot inversion type, for example, at an odd-numbered frame, odd-numbered liquid crystal pixels on odd-numbered gate lines and even-numbered liquid crystal pixels on even-numbered gate lines may be charged with pixel data signals of positive polarities, and even-numbered liquid crystal pixels on odd-numbered gate lines and odd-numbered liquid crystal pixels on even-numbered gate lines may be charged with pixel data signals of negative polarities. Also, at an even-numbered frame, odd-numbered liquid crystal pixels on odd-numbered gate lines and even-numbered liquid crystal pixels on even-numbered gate lines may be charged with pixel data signals of negative polarities, and even-numbered liquid crystal pixels on odd-numbered gate lines and odd-numbered liquid crystal pixels on even-numbered gate lines may be charged with pixel data signals of positive polarities.

However, when the charging polarity of the liquid crystal is periodically changed, flicker may occur in the liquid crystal panel. Flicker refers to a phenomenon in which luminance or color change of light is visible at a relatively small period, so that a flicker occurs on the screen or a screen is shaken. In general, the flicker phenomenon is known as an image quality characteristic that occurs when a transmittance difference between two polarities occurs when charging polarities of the liquid crystals, that is, a positive (+) polarity and a negative (−) polarity are periodically inverted.

In the liquid crystal panel, the respective pixels are distributed over an entire surface of the panel, whereas a voltage for controlling each pixel is generally applied in one direction. Therefore, resistance capacitance (RC) delay may occur along a specific direction of the liquid crystal panel, and since the same voltage cannot be applied to each pixel, a flicker phenomenon may become serious. In addition, when characteristics of thin film transistors for driving each pixel of the liquid crystal panel are not uniform and performance deviation between the thin film transistors is present along a specific direction, occurrence of flicker in the liquid crystal panel may be severe.

SUMMARY

The present disclosure has been made in view of the above problems and it is an object of the present disclosure to provide a display apparatus that reduces occurrence of flicker. A display apparatus according to one embodiment of the present disclosure is a liquid crystal display apparatus.

It is another object of the present disclosure to provide a method for preventing flicker from occurring in a display apparatus by adjusting an arrangement position of a bump.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a display apparatus comprising a plurality of data lines; a plurality of gate lines, each of the plurality of gate lines crossing at least one of the plurality of data lines; a plurality of thin film transistors, each of the plurality of thin film transistors electrically connected to at least one of the plurality of data lines and one at least of the plurality of gate lines, and each of the plurality of thin film transistors includes an active layer, wherein a first plurality of active layers are disposed along a gate line from the plurality of gate lines; and a plurality of bumps disposed on at least some of the plurality of thin film transistors, the plurality of bumps including a first plurality of bumps and a second plurality of bumps; wherein each of the first plurality of bumps overlaps at least one of the first plurality of active layers, but a portion of the first plurality of active layers disposed along the gate line is not overlapped by any of the first plurality of bumps, and two or more active layers from the portion of the first plurality of active layers that are not overlapped by any of the first plurality of bumps are not continuously disposed along the gate line, wherein a second plurality of active layers are disposed along a data line from the plurality of data lines, but a portion of the second plurality of active layers disposed along the data line is not overlapped by any of the second plurality of bumps, and two or more active layers from the portion of the second plurality of active layers that are not overlapped by any of the second plurality of bumps are not continuously disposed along the data line.

A display apparatus comprising: a first substrate; a plurality of data lines on the first substrate; a plurality of gate lines on the first substrate, each of the plurality of gate lines crossing at least one of the plurality of data lines; a first thin film transistor connected to one of the plurality of data lines and one of the plurality of gate lines, the first thin film transistor including an active layer, a gate electrode spaced apart from the active layer, a source electrode connected to the active layer, and a drain electrode connected to the active layer; a first electrode connected to the first thin film transistor; a second electrode; a liquid crystal layer on the first electrode; and a bump disposed on the first electrode, the bump overlapping the active layer of the thin film transistor.

BRIEF DESCRIPTION OF THE DRAWINGS

The above and other objects, features and other advantages of the present disclosure will be more clearly understood from the following detailed description taken in conjunction with the accompanying drawings, in which:

FIG. 6 is a schematic view illustrating a damage of a thin film transistor, which is caused by light;

DETAILED DESCRIPTION

Figure 1:
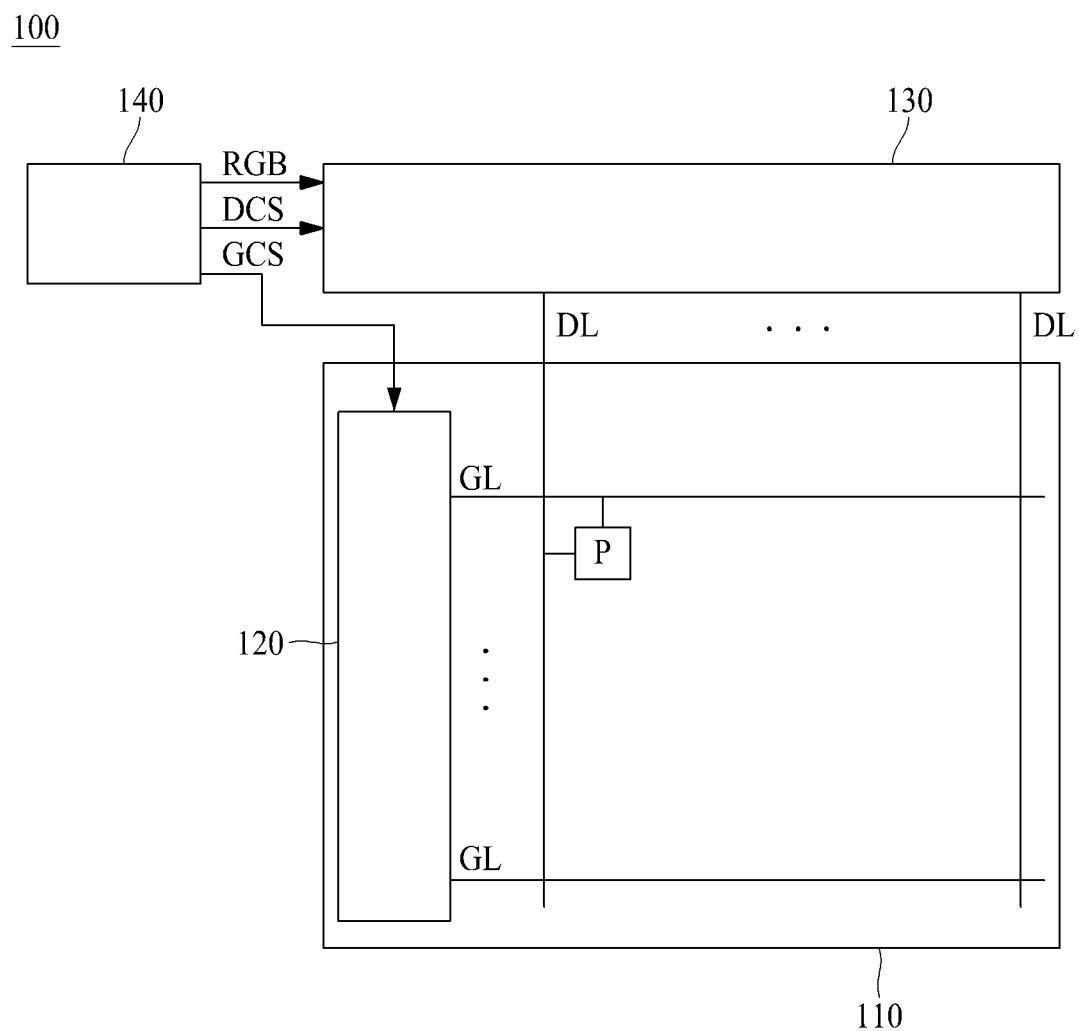
FIG. 1 is a schematic view illustrating a display apparatus according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above', 'below~', and 'next to~', one or more portions may be arranged between two other portions unless 'just' or 'direct' is used.

Spatially relative terms such as "below", "beneath", "lower", "above", and "upper" may be used herein to easily describe a relationship of one element or elements to another element or elements as illustrated in the figures. It will be understood that these terms are intended to encompass different orientations of the device in addition to the orientation depicted in the figures. For example, if the device illustrated in the figure is reversed, the device described to be arranged "below", or "beneath" another device may be arranged "above" another device. Therefore, an exemplary term "below or beneath" may include "below or beneath" and "above" orientations. Likewise, an exemplary term "above" or "on" may include "above" and "below or beneath" orientations.

In describing a temporal relationship, for example, when the temporal order is described as "after," "subsequent," "next," and "before," a case which is not continuous may be included, unless "just" or "direct" is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present invention.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

In the drawings, the same or similar elements are denoted by the same reference numerals even though they are depicted in different drawings.

In the embodiments of the present disclosure, a source electrode and a drain electrode are distinguished from each other, for convenience of description. However, the source electrode and the drain electrode may be used interchangeably. The source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

FIG. 1 is a schematic view illustrating a display apparatus 100 according to one embodiment of the present disclosure.

As shown in FIG. 1, the display apparatus 100 according to one embodiment of the present disclosure includes a display panel 110, a gate driver 120, a data driver 130, and a controller 140.

The display panel 110 includes a plurality of gate lines GL, a plurality of data lines DL, and a plurality of pixels P disposed in intersection areas between the plurality of gate lines GL and the plurality of data lines DL. An image is displayed on the display panel 110 by the driving of the pixel P.

The controller 140 controls the gate driver 120 and the data driver 130 according to one embodiment of the present disclosure.

The controller 140 outputs a gate control signal GCS for controlling the gate driver 120 and a data control signal DCS for controlling the data driver 130 by using a vertical/horizontal synchronizing signal and a clock signal, which are supplied from an external system (not shown). Further, the controller 140 samples input image data input from the external system and realigns the sampled input image data to supply the image data RGB to the data driver 130.

The gate control signal GCS includes a gate start pulse GSP, a gate shift clock GSC, a gate output enable signal GOE, a start signal Vst and a gate clock GCLK. Also, control signals for controlling a shift register may be included in the gate control signal GCS.

The data control signal DCS includes a source start pulse SSP, a source shift clock signal SSC, a source output enable signal SOE and a polarity control signal POL.

The data driver 130 supplies a data voltage to the data lines DL of the display panel 110 according to one embodiment of the present disclosure. In detail, the data driver 130 converts the image data RGB input from the controller 140 into a data voltage and supplies the data voltage to the data lines DL.

The gate driver 120 sequentially supplies a gate pulse GP to the gate lines GL during one frame. The gate pulse GP is a signal for turning on a switching element connected to the gate line GL, and may also be referred to as a gate-on signal. In this case, the one frame refers to a period at which one image is output through the display panel 110. Further, the gate driver 120 supplies a gate-off signal Goff, which is capable of turning off the switching element, to the gate line GL during the other period of the one frame, at which the gate pulse GP is not supplied. Hereinafter, the gate pulse GP and the gate-off signal Goff are collectively referred to as a scan signal SS.

According to one embodiment of the present disclosure, the gate driver 120 may be packaged on the display panel 110. In this way, a structure in which the gate driver 120 is directly packaged on the display panel 100 is referred to as a gate-in-panel (GIP) structure.

Figure 2:
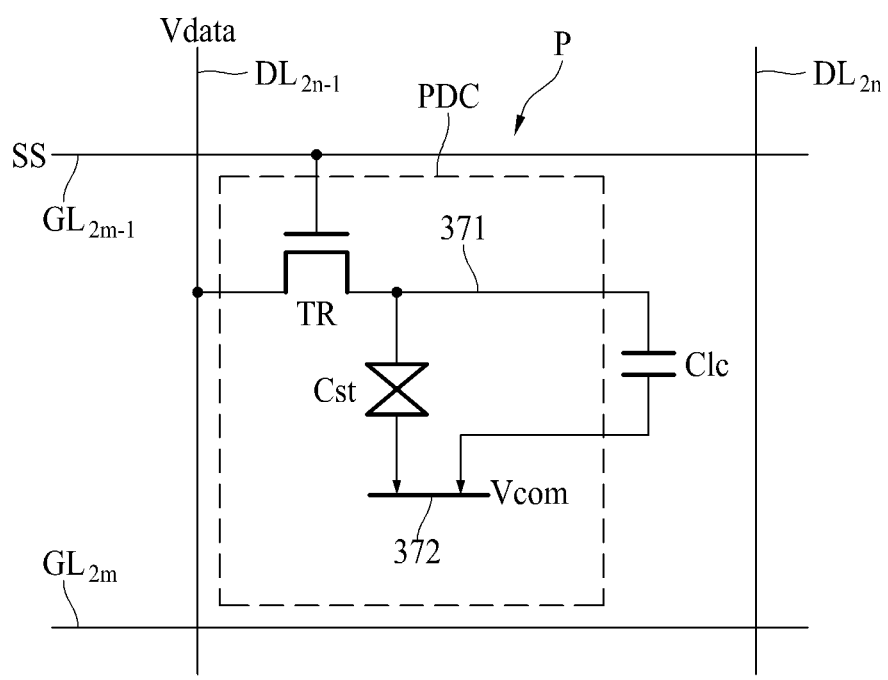
FIG. 2 is a circuit diagram illustrating any one pixel included in the display apparatus of FIG. 1 according to one embodiment of the present disclosure.

FIG. 2 is a circuit diagram illustrating any one pixel P of the display apparatus 100 shown in FIG. 1 according to one embodiment of the present disclosure. The circuit diagram of FIG. 2 is an equivalent circuit diagram of a pixel P of a liquid crystal display that includes a liquid crystal LC.

As shown in FIG. 2, the pixel P of the liquid crystal display may include a pixel driver PDC and a liquid crystal capacitor Clc that is a display element. The liquid crystal capacitor Clc may include a first electrode 371, a second electrode 372, and a liquid crystal layer LC disposed between the first electrode 371 and the second electrode 371 (not shown in FIG. 2).

Referring to FIG. 2, the pixel driver PDC includes a thin film transistor TR electrically connected to any one $GL_{2n-1}$ of a plurality of gate lines GL and any one $DL_{2n-1}$ of a plurality of data lines DL. A storage capacitor Cst may be formed between the thin film transistor TR and the second electrode 372, and the liquid crystal capacitor Clc may be connected with the storage capacitor Cst between the thin film transistor TR and the second electrode 372 in parallel.

The liquid crystal capacitor Clc, which is a display element, charges a differential voltage between the data signal supplied to the first electrode 371 through the thin film transistor TR and the common voltage Vcom supplied to the second electrode 372, and controls the amount of light transmission by driving the liquid crystal in accordance with the charged voltage. The storage capacitor Cst stably maintains the voltage charged in the liquid crystal capacitor Clc.

Figure 3:
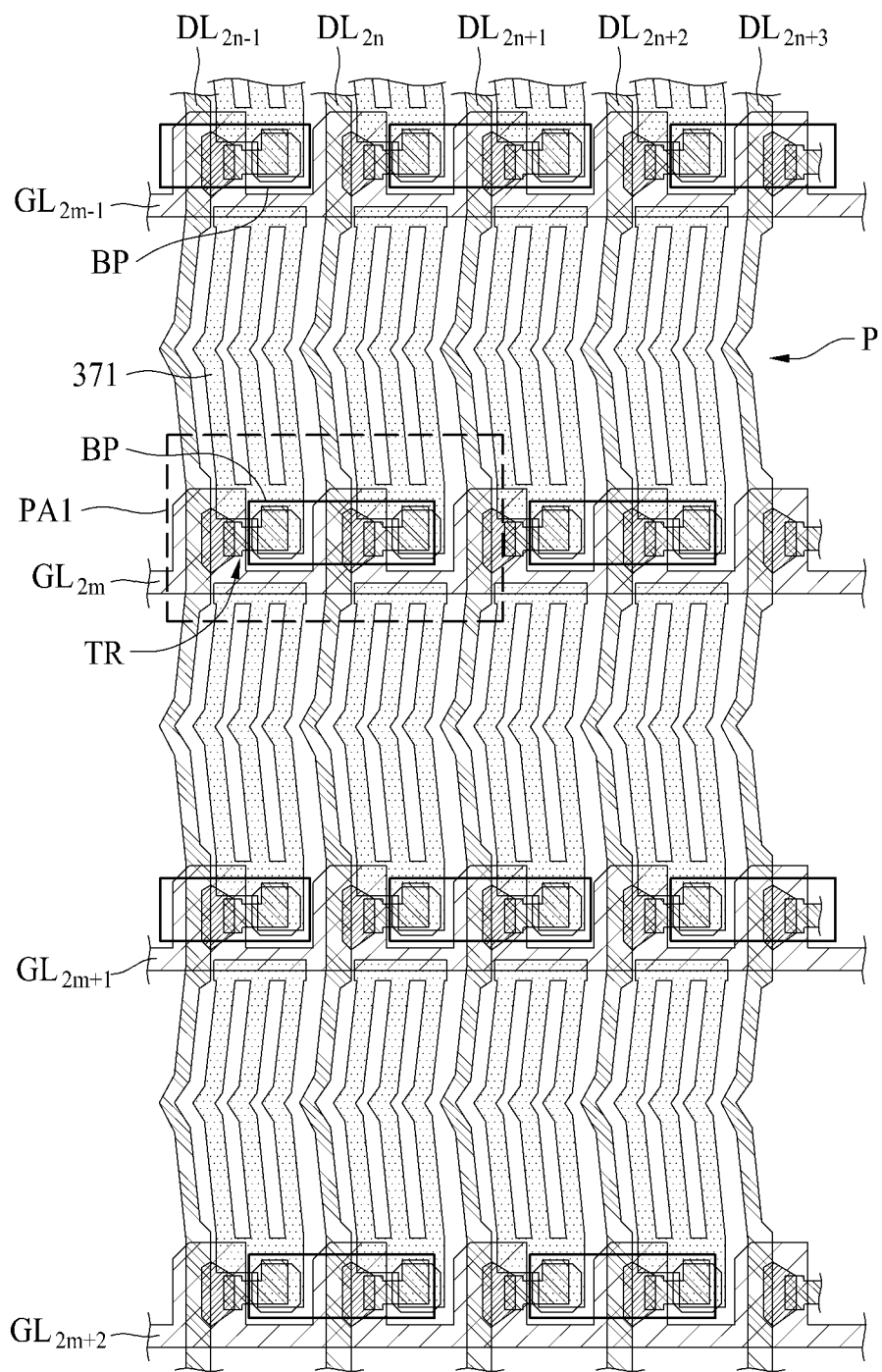
FIG. 3 is a plan view illustrating pixels of the display apparatus according to one embodiment of the present disclosure.
Figure 4:
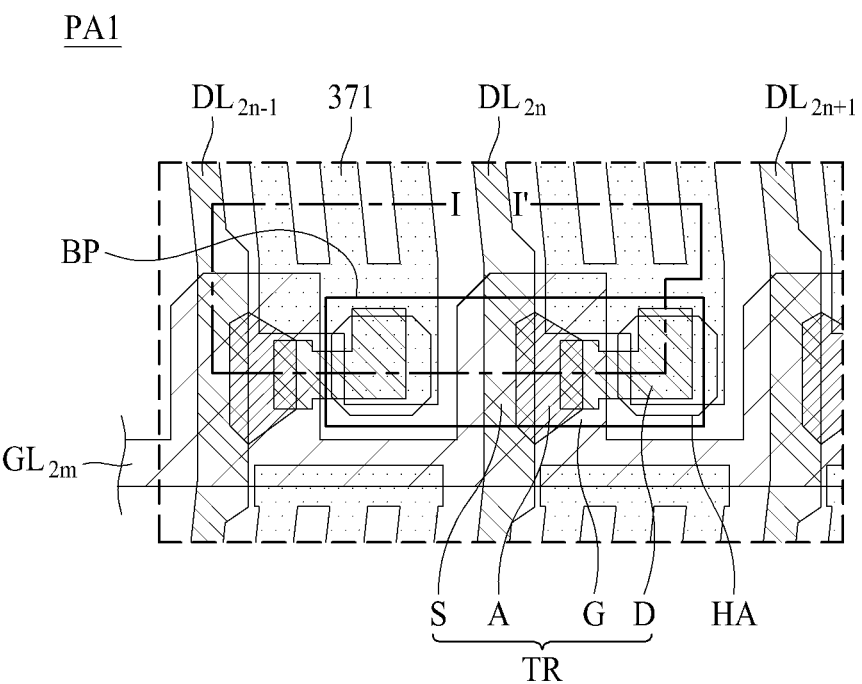
FIG. 4 is an enlarged view illustrating a portion PA1 of the display apparatus shown in FIG. 3 according to one embodiment of the present disclosure.
Figure 5:
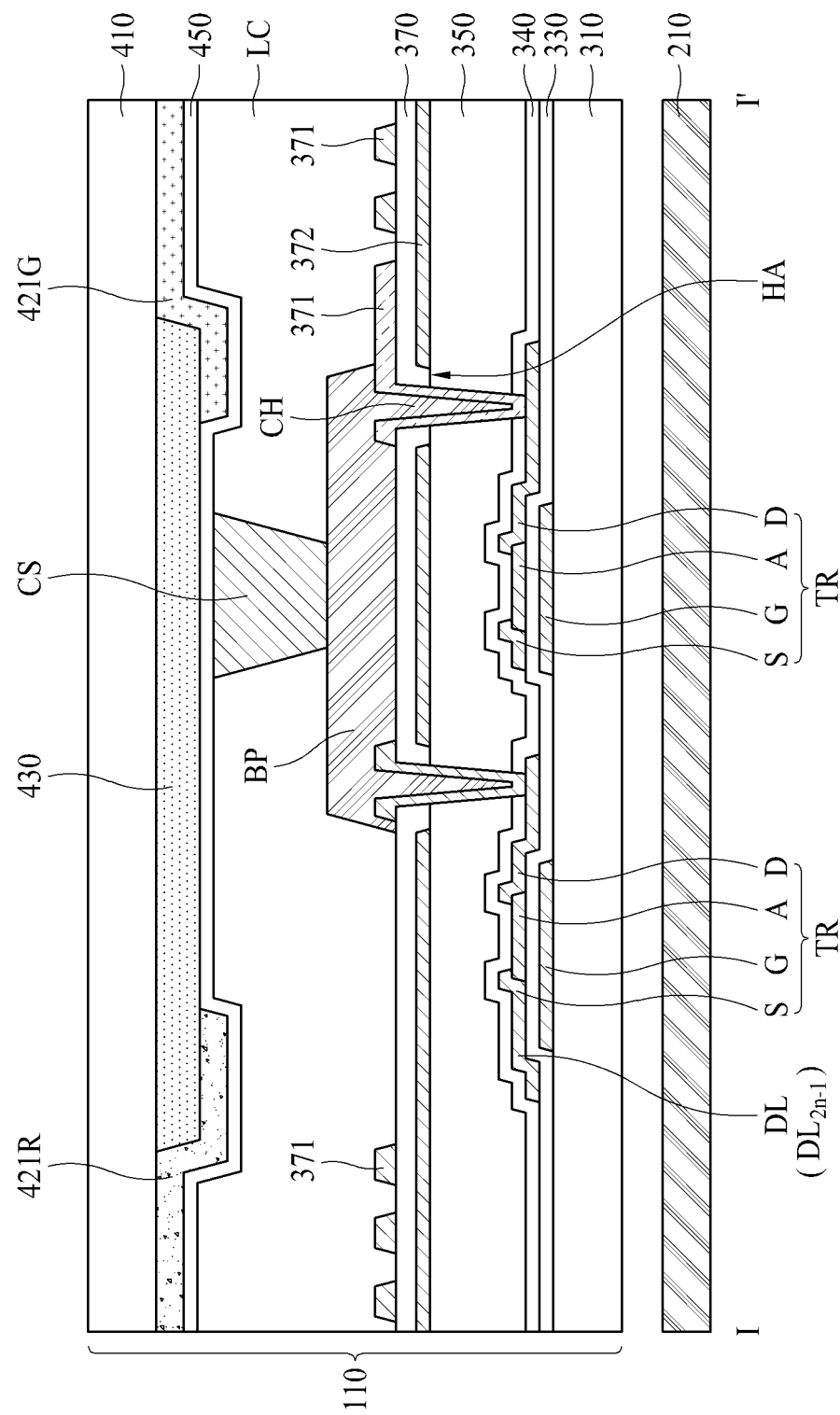
FIG. 5 is a cross-sectional view of the display apparatus taken along line I-I' of FIG. 4 according to one embodiment of the present disclosure.

FIG. 3 is a plan view illustrating pixels P of a display apparatus 100 according to one embodiment of the present disclosure, FIG. 4 is an enlarged view illustrating a portion PA1 of the display apparatus 100 shown in FIG. 3, and FIG. 5 is a cross-sectional view of the display apparatus 100 taken along line I-I' of FIG. 4 according to one embodiment of the present disclosure.

Referring to FIG. 5, the display apparatus 100 according to one embodiment of the present disclosure includes a backlight unit 210 for emitting light to a display panel 110.

Referring to FIGS. 3 and 4, the display apparatus 100 according to one embodiment of the present disclosure includes a plurality of thin film transistors TR, each thin film transistors TR electrically connected to one of a plurality of data lines DL and one of a plurality of gate lines GL. Each of the plurality of gate lines GL may cross at least one of the plurality of data lines DL.

Referring to FIG. 4, each thin film transistor TR is connected to one of the plurality of data lines DL and one of the plurality of gate lines GL. Each of the plurality of thin film transistors TR includes an active layer A, a gate electrode G, a source electrode S, and a drain electrode D.

Referring to FIGS. 3, 4 and 5, a plurality of bumps BP are disposed on a plurality of thin film transistors TR. According to one embodiment of the present disclosure, the number of bumps BP may not be the same as the number of thin film transistors TR. For example, the total number of bumps BP may be greater than the total number of thin film transistors TR or the total number of bumps BP may be less than the total number of thin film transistors TR. According to one embodiment of the present disclosure, each of the plurality of bumps BP may overlap at least one of the plurality of active layers A. According to one embodiment of the present disclosure, the number of bumps BP may not be the same as the number of active layers A. The number of bumps BP may be less than the number of active layers A according to one embodiment.

According to one embodiment of the present disclosure, as shown in FIGS. 3 and 4, a plurality of active layers A are disposed along one of the gate lines $GL_{2m-1}$, $GL_{2m}$, $GL_{2m+1}$, $GL_{2m+2}$, . . . . A portion of the plurality of active layers A disposed along one of the gate lines $GL_{2m-1}$, $GL_{2m}$, $GL_{2m+1}$, $GL_{2m+2}$, . . . does not overlap the bump BP. For example, among the active layers A disposed along the (2m)th gate line $GL_{2m}$, the odd-numbered active layers A corresponding to the odd-numbered data lines $DL_{2n-1}$, $DL_{2n+1}$, $DL_{2n-3}$, . . . do not overlap the bump BP. In this case, n and m are natural numbers.

Two or more active layers A, which do not overlap the bump BP, among the active layers A disposed along one of the gate lines $GL_{2m-1}$, $GL_{2m}$, $GL_{2m+1}$, $GL_{2m+2}$, . . . are not continuous.

Referring to FIG. 3, an active layer A that does not overlap the bump BP and an active layer A that overlaps the bump BP are alternately disposed along one of the gate lines $GL_{2m-1}$, $GL_{2m}$, $GL_{2m+1}$, $GL_{2m+2}$, . . . . According to one embodiment of the present disclosure, two or more active layers A that overlap the bumps BP along one of the gate lines $GL_{2m-1}$, $GL_{2m}$, $GL_{2m+1}$, $GL_{2m+2}$, . . . are not continuous.

According to one embodiment of the present disclosure, a plurality of active layers A are disposed along one data line $DL_{2n-1}$, $DL_{2n}$, $DL_{2n+1}$, $DL_{2n+2}$, $DL_{2n+3}$, . . . . A portion of the plurality of active layers A disposed along one of the data lines $DL_{2n-1}$, $DL_{2n}$, $DL_{2n+1}$, $DL_{2n+2}$, $DL_{2n+3}$, . . . does not overlap the bump BP. For example, among the active layers A disposed along the (2n)th data line $DL_{2n}$, the odd-numbered active layers A corresponding to the odd-numbered gate lines $GL_{2m-1}$, $GL_{2m+1}$, . . . do not overlap the bump BP.

Among the plurality of active layers A disposed along one of the data lines $DL_{2n-1}$, $DL_{2n}$, $DL_{2n+1}$, $DL_{2n+2}$, $DL_{2n+3}$, . . . , two or more active layers that do not overlap the bump BP are not continuous.

Referring to FIG. 3, the active layers A that do not overlap the bump BP and the active layers A that overlap the bump BP are alternately disposed along one of the data lines $DL_{2n-1}$, $DL_{2n}$, $DL_{2n+1}$, $DL_{2n+2}$, $DL_{2n+3}$, . . . . According to one embodiment of the present disclosure, among the plurality of active layers A disposed along one of the data lines $DL_{2n-1}$, $DL_{2n}$, $DL_{2n+1}$, $DL_{2n+2}$, $DL_{2n+3}$, . . . , two or more active layers A that overlap the bump BP are not continuous.

Referring to FIG. 3, in the display apparatus 100 according to one embodiment of the present disclosure, the bump BP is disposed on the active layer A of the thin film transistor TR connected to the odd-numbered data lines $DL_{2n-1}$, $DL_{2n+1}$, $DL_{2n+3}$, . . . of the plurality of data lines DL and the odd-numbered gate lines $GL_{2m-1}$, $GL_{2m+1}$, . . . of the plurality of gate lines GL. In addition, the bump BP is disposed on the active layer A of the thin film transistor TR connected to the even-numbered data lines $DL_{2n}$, $DL_{2n+2}$, . . . of the plurality of data lines DL and the even-numbered gate lines $GL_{2m}$, $GL_{2m+2}$, . . . of the plurality of gate lines GL.

According to one embodiment of the present disclosure, the plurality of bumps BP may have the same shape. The plurality of bumps may be made of the same material by the same process in the same method.

According to one embodiment of the present disclosure, the bump BP is not disposed on the active layer A of the thin film transistor TR connected to the even-numbered data lines $DL_{2n}$, $DL_{2n+2}$, . . . of the plurality of data lines and the odd-numbered gate lines $GL_{2m-1}$, $GL_{2m+1}$, . . . of the plurality of gate lines. In addition, the bump BP is not disposed on the active layer A of the thin film transistor TR connected to the odd-numbered data lines $DL_{2n-1}$, $DL_{2n+1}$ . . . of the plurality of data lines and the even-numbered gate lines $GL_{2m}$, $GL_{2m+2}$, . . . of the plurality of gate lines.

Hereinafter, a stacked structure of the display apparatus 100 according to one embodiment of the present disclosure will be described in more detail with reference to FIGS. 4 and 5.

Referring to FIG. 5, the thin film transistor TR is disposed on a substrate 310 according to one embodiment.

The substrate 310 may be made of glass or plastic. A plastic having flexible characteristics, for example, polyimide (PI), may be used as the substrate 310.

Although not shown, a buffer layer may be disposed on the substrate 310. The buffer layer may be made of an insulating material, and may serve to protect the active layer A from moisture or oxygen introduced from the outside. The buffer layer may be formed of an insulating material such as silicon oxide, silicon nitride and the like.

A gate electrode G is disposed on the substrate 310, a gate insulating layer 330 is disposed on the gate electrode G, and an active layer A is disposed on the gate insulating layer 330. In detail, an active layer A is disposed on the substrate 310.

The active layer A includes a semiconductor material. The active layer A may include at least one of an amorphous silicon (A-Si) semiconductor material, a crystalline silicon (LTPS) semiconductor material or an oxide semiconductor material.

For example, an oxide semiconductor material, for example, IZO(InZnO)-based, IGO(InGaO)-based, GO(GaO)-based, ITO(InSnO)-based, IGZO(InGaZnO)-based, IGTO(InGaSnO)-based, IGZTO(InGaZnSnO)-based, GZTO(GaZnSnO)-based, GZO(GaZnO)-based and ITZO (InSnZnO)-based oxide semiconductor material may be used.

Referring to FIG. 5, a gate insulating layer 330 is disposed between the active layer A and the gate electrode G. The gate insulating layer 330 has insulation properties. The gate insulating layer 330 may be patterned together with the gate electrode G or may not be patterned. According to one embodiment of the present disclosure, as shown in FIG. 5, the gate insulating layer 330 may be disposed on an entire surface of the substrate 310 that includes an upper surface of the active layer A.

A gate electrode G is disposed on the substrate 310, for example, under the gate insulating layer 330. The active layer A and the gate electrode G are insulated from each other by the gate insulating layer 330.

The gate electrode G may be a portion extended from the gate line GL, and may be portion of the gate line GL. The gate electrode G and the gate line GL may include at least one of aluminum-based metals such as aluminum (Al) or aluminum alloys, silver-based metals such as silver (Ag) or silver alloys, copper-based metals such as copper (Cu) or copper alloys, molybdenum-based metals such as molybdenum (Mo) or molybdenum alloys, chromium (Cr), tantalum (Ta), neodymium (Nd) or titanium (Ti). The gate electrode G and the gate line GL may have a multi-layered structure that includes at least two conductive layers having different physical properties.

Referring to FIG. 5, a source electrode S, a drain electrode D, and a data line DL are disposed on the gate insulating layer 330. The source electrode S and the drain electrode D are spaced apart from each other and are connected to the active layer A, respectively. The source electrode S may be extended to the data line DL, and may be a portion of the data line DL. In one embodiment of the present disclosure, the source electrode S and the drain electrode D are distinguished from each other for convenience of description. According to one embodiment of the present disclosure, the source electrode S and the drain electrode D may be exchanged.

The data line DL provides a data voltage Vdata to the pixel driver PDC, and the thin film transistor TR controls application of the data voltage Vdata.

According to one embodiment of the present disclosure, the odd-numbered data lines DL may be represented by $DL_{2n-1}$, $DL_{2n+1}$, $DL_{2n+3}$, . . . and the even-numbered data lines DL may be represented by $DL_{2n}$, $DL_{2n+2}$, $DL_{2n+4}$, . . . . Likewise, according to one embodiment of the present disclosure, the odd-numbered gate lines GL may be represented by $GL_{2m-1}$, $GL_{2m+1}$, $GL_{2m+3}$, . . . and the even-numbered gate line GL may be represented by $GL_{2m}$, $GL_{2m+2}$, $GL_{2m+4}$, . . . .

The thin film transistor TR is formed by the active layer A, the gate electrode G, the source electrode S, and the drain electrode D.

A passivation layer 340 is disposed on the source electrode S, the drain electrode D and the data line DL. The passivation layer 340 protects the active layer A and the gate electrode G.

A planarization layer 350 is disposed on the passivation layer 340. The planarization layer 350 planarizes an upper portion of the thin film transistor TR and protects the thin film transistor TR.

The second electrode 372 of the display element is disposed on the planarization layer 350. The second electrode 372 may be formed in the form of a surface electrode. The second electrode 372 may be disposed in the entire area of the substrate 310 except for a contact hole area HA for connecting the first electrode 371 with the thin film transistor TR. According to one embodiment of the present disclosure, a common voltage is applied to the second electrode 372. Therefore, the second electrode 372 may be referred to as a common electrode.

According to one embodiment of the present disclosure, the second electrode 372 includes a transparent conductive oxide (TCO). Examples of the transparent conductive oxide (TCO) include, for example, ITO (InSnO), IZO (InZnO), IZTO (InZnSnO) and ZO (ZnO).

An interlayer insulating layer 370 is disposed on the second electrode 372. The interlayer insulating layer 370 insulates the first electrode 371 and the second electrode 372 from each other.

The first electrode 371 is disposed on the interlayer insulating layer 370. According to one embodiment of the present disclosure, the first electrode 371 includes a transparent conductive oxide (TCO). Examples of the transparent conductive oxide (TCO) include ITO (InSnO), IZO (InZnO), IZTO (InZnSnO) and ZO (ZnO).

According to one embodiment of the present disclosure, the first electrode 371 may be a pixel electrode of the display element constituting the liquid crystal display.

However, one embodiment of the present disclosure is not limited to the above embodiment, and the first electrode 371 may be a common electrode or the second electrode 372 may be a common electrode. In addition, the positions of the first electrode 371 and the second electrode 372 may be exchanged.

In the display apparatus 100 shown in FIGS. 4 and 5, the first electrode 371 serves as a pixel electrode, and the second electrode 372 serves as a common electrode according to one embodiment.

Referring to FIGS. 4 and 5, the first electrode 371 has a line electrode shape, and the second electrode 372 has a surface electrode shape, but one embodiment of the present disclosure is not limited thereto. The first electrode 371 may have a surface electrode shape, the second electrode 372 may have a line electrode shape, both the first electrode 371 and the second electrode 372 may have a line electrode shape, or both the first electrode 371 and the second electrode 372 may have a surface electrode shape in other embodiments.

Referring to FIG. 5, a contact hole CH may be formed to connect the thin film transistor TR with the first electrode 371. The contact hole CH may be formed in a contact hole area HA in which the second electrode 372 is not formed. The contact hole CH may expose a portion of the drain electrode D of the thin film transistor TR by passing through the interlayer insulating layer 370, the planarization layer 350, and the passivation layer 340.

The first electrode 371 may be connected to the drain electrode D of the thin film transistor TR through the contact hole CH.

The bump BP is disposed on the interlayer insulating layer 370. The bump BP overlaps the active layer A of the thin film transistor TR. In addition, the bump BP may overlap a portion of the first electrode 371, and may also overlap the contact hole CH. According to one embodiment of the present disclosure, the bump BP may fill a recess portion of the contact hole CH. The bump BP may be stably disposed on the interlayer insulating layer 370 by filling the recess portion of the contact hole CH. According to one embodiment of the present disclosure, the bump BP is spaced apart from another bump BP to facilitate dispersion of the liquid crystal. As shown in FIG. 5, the second electrode 372 is disposed between the thin film transistor TR and the bump BP. The bump BP may include an insulating material. The bump BP may include an organic material, an inorganic material or mixture of organic material and inorganic material. For example, the bump BP may include an organic insulating material. The bump BP may include the same material as the planarization layer 350. The bump BP may include a photosensitive material. For example, the bump BP may include a photoresist (PR) material.

The liquid crystal layer LC is disposed on the first electrode 371. In detail, an opposite substrate 410 is disposed to face the substrate 310, and the liquid crystal layer LC is disposed between the substrate 310 and the opposite substrate 410.

Referring to FIG. 5, color filters 421R and 421G are disposed on the opposite substrate 410, and a black matrix 430 is disposed between the color filters 421R and 421G. The black matrix 430 allows the pixel areas to be distinguished from each other.

Although FIG. 5 illustrates one embodiment in which the color filter 421 (421R and 421G) is disposed on the opposite substrate 410, another embodiment of the present disclosure is not limited thereto. The color filter 421 (421R and 421G) may be disposed on the substrate 310.

An overcoat layer 450 is disposed on the color filters 421R and 421G and the black matrix 430. The overcoat layer 450 protects the color filters 421R and 421G.

A column spacer CS is disposed on the overcoat layer 450. According to one embodiment of the present disclosure, the column spacer CS may be disposed on at least a portion of a plurality of bumps BP.

The column spacer CS may be positioned on the bump BP. For example, a bottom surface of the column spacer CS may be in contact (e.g., direct contact) with an upper surface of the bump BP and a second surface of the column spacer CS may be on the opposite substrate 410. Therefore, in the display apparatus 100 according to one embodiment of the present disclosure, a gap between the substrate 310 and the opposite substrate 410 may be maintained by the bump BP and the column spacer CS. As shown in FIG. 5, in one embodiment a width of the bump BP is greater than a width of the column spacer CS. Furthermore, the column spacer CS is positioned so as to overlap the bump BP and the active layer A of the thin film transistor TR.

In addition, according to one embodiment of the present disclosure, even though the column spacer CS moves while the display apparatus 100 is being used, since the bump BP exists, elements disposed on the substrate 310, for example, the first electrode 371 or an alignment layer (not shown) may be prevented from being damaged by friction.

According to one embodiment of the present disclosure, the bump BP and the column spacer CS may overlap the black matrix 430. For example, the column spacer CS may be disposed between the bump BP and the black matrix 430.

FIG. 6 is a schematic view illustrating a damage of a thin film transistor, which is caused by light according to one embodiment.

Referring to FIG. 6, lights L1 and L2 generated by the backlight unit 210 are irradiated to the display panel 110. When a bump BP is disposed on a path through which the lights L1 and L2 generated by the backlight unit 210 pass, reflection may be made on a lower surface of the bump BP, and the reflected light may be irradiated to the active layer A of the thin film transistor TR that overlaps the bump BP. As a result, physical properties of the active layer A may vary, and when the physical properties of the active layer A are changed, driving characteristics of the thin film transistor TR may vary.

In the display panel 110 driven in an inversion type, when the thin film transistor TR having changed physical properties is disposed side-by-side along a direction in which the polarity of the pixel P is changed, a flicker phenomenon may occur due to an influence of signal inversion.

Figure 7A:
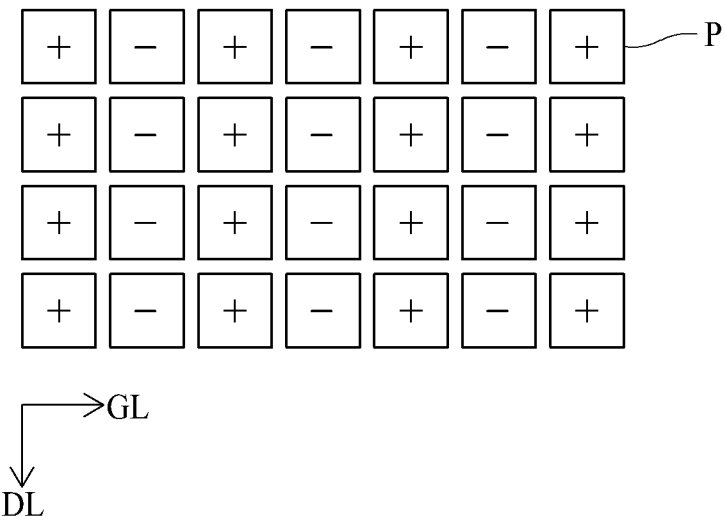
FIGS. 7A and 7B are schematic views illustrating a method for driving a liquid crystal in a column inversion type according to one embodiment of the present disclosure.
Figure 7B:
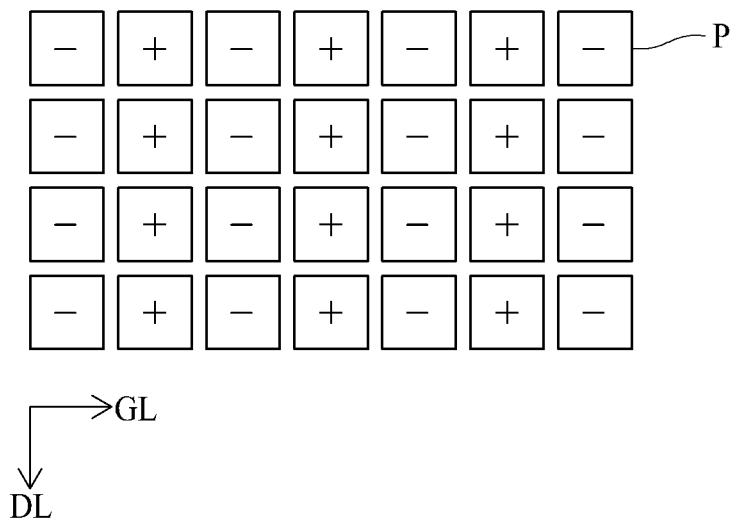

FIGS. 7A and 7B are schematic views illustrating a method for driving a liquid crystal in a column inversion method according to one embodiment. FIG. 7A shows a polarity of a data signal applied to each pixel P at an odd-numbered frame, for example. FIG. 7B shows a polarity of a data signal applied to each pixel P at an even-numbered frame, for example.

According to one embodiment of the present disclosure, at the odd-numbered frame, a data signal of a positive (+) polarity may be applied to the odd-numbered data lines $DL_{2n-1}$, $DL_{2n+1}$, $DL_{2n+3}$, . . . and a data signal of a negative (−) polarity may be applied to the even-numbered data lines $DL_{2n}$, $DL_{2n+2}$, . . . .

In addition, at the even-numbered frame, a data signal of a negative (−) polarity may be applied to the odd-numbered data lines $DL_{2n-}$, $DL_{2n+1}$, $DL_{2n+3}$, . . . and a data signal of a positive (+) polarity may be applied to the even-numbered data lines $DL_{2n}$, $DL_{2n+2}$, . . . .

As a result, as shown in FIG. 7A, at the odd-numbered frame, a pixel data signal of a positive (+) polarity may be charged in the pixels P on the odd-numbered data lines, and a pixel data signal of a negative (−) polarity may be charged in the pixels P on the even-numbered data lines.

Also, referring to FIG. 7B, at the even-numbered frame, a pixel data signal of a negative (−) polarity may be charged in the pixels P on the odd-numbered data lines, and a pixel data signal of a positive (+) polarity may be charged in the pixels P on the even-numbered data lines.

As described above, in the display panel 110 driven in the inversion type, the bump BP is disposed on the active layer A of the thin film transistor TR disposed in the pixel P of the odd-numbered line, and when the bump BP is not disposed on the active layer A of the thin film transistor TR disposed in the pixel P of the even-numbered line, the driving characteristics of the thin film transistor TR disposed in the pixel P of the odd-numbered line may be changed. As a result, the driving characteristics of the thin film transistor TR of the odd-numbered line and the thin film transistor TR of the even-numbered line may vary, whereby the driving characteristics of the thin film transistor TR may vary for each line. In this situation, when the display panel 110 is driven in the column inversion type as shown in FIGS. 7A and 7B, a transmittance difference between the liquid crystals is severe for each line, whereby the flicker phenomenon may be remarkable.

In order to solve this problem, according to one embodiment of the present disclosure, the bump BP is disposed on the active layer A of the thin film transistor TR connected to the odd-numbered data lines $DL_{2n-1}$, $DL_{2n+1}$, ... and the odd-numbered gate lines $GL_{2m-1}$, $GL_{2m+1}$, .... In addition, the bump BP is also disposed on the active layer A of the thin film transistor TR connected to the even-numbered data lines $DL_{2n}$, $DL_{2n+2}$, ... and the even-numbered gate lines $GL_{2m}$, $GL_{2m+2}$, ....

As described above, according to one embodiment of the present disclosure, the bump BP is alternately arranged for each line of the pixel (zig-zag arrangement) so that the thin film transistor TR, of which driving characteristics are changed, is uniformly distributed on the display panel 110. As a result, occurrence of flicker may be reduced.

According to one embodiment of the present disclosure, in order to facilitate dispersion of the liquid crystal when the liquid crystal is injected, the bump BP is not disposed on some areas.

According to one embodiment of the present disclosure, bumps BP are not disposed on the active layer A of the thin film transistor TR connected to the even-numbered data lines $DL_{2n}$, $DL_{2n+2}$, ... and the odd-numbered gate lines $GL_{2m-1}$, $GL_{2m+1}$, .... As a result, when the liquid crystal is injected, dispersion of the liquid crystal is not deteriorated due to the bump BP.

According to another embodiment of the present disclosure, the display panel 110 may be driven in a two-dot inversion method.

Figure 8A:
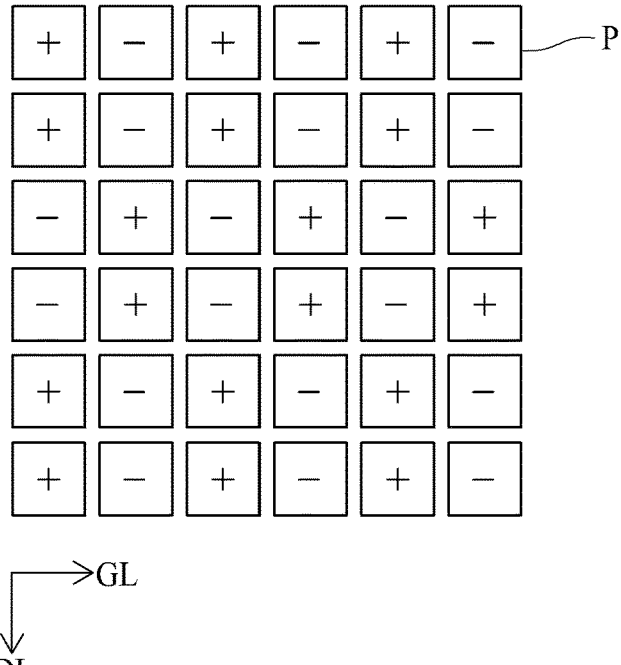
FIGS. 8A and 8B are schematic views illustrating a method for driving a liquid crystal in a two-dot inversion type according to one embodiment of the present disclosure.
Figure 8B:
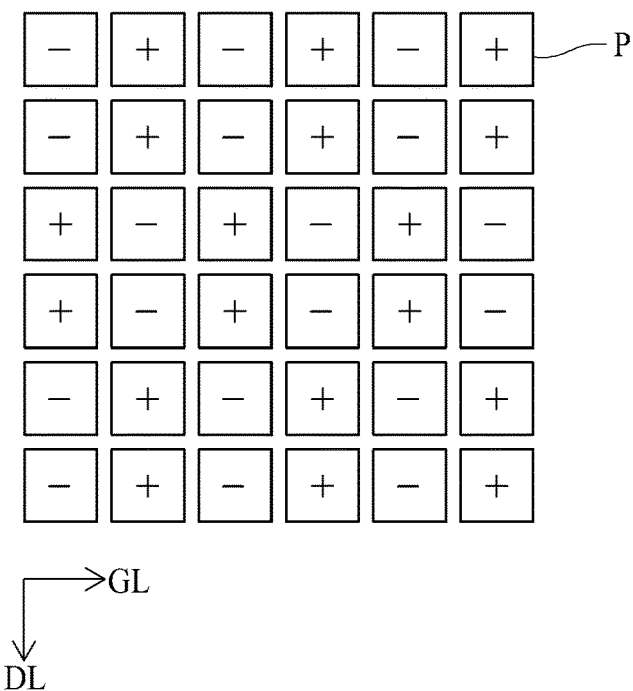

FIGS. 8A and 8B are schematic views illustrating a method for driving a liquid crystal in a two-dot inversion type according to one embodiment. FIG. 8A shows a polarity of a data signal applied to each pixel P at an odd-numbered frame, for example. FIG. 8B shows a polarity of a data signal applied to each pixel P at an even-numbered frame, for example.

According to another embodiment of the present disclosure, at the odd-numbered frame, when a gate-on signal is applied to (4p+1)th and (4p+2)th gate lines, a data signal of a positive (+) polarity may be applied to the odd-numbered data lines $DL_{2n-1}$, $DL_{2n+1}$, $DL_{2n+3}$, ..., and a data signal of a negative (−) polarity may be applied to the even-numbered data lines $DL_{2n}$, $DL_{2n+2}$, ....

Also, at the odd-numbered frame, when a gate-on signal is applied to (4p+3)th and (4p+4)th gate lines, a data signal of a negative (−) polarity may be applied to the odd-numbered data lines $DL_{2n-1}$, $DL_{2n+1}$, $DL_{2n+3}$, ..., and a data signal of a positive (+) polarity may be applied to the even-numbered data lines $DL_{2n}$, $DL_{2n+2}$, ....

At the even-numbered frame, when a gate-on signal is applied to the (4p+1) and (4p+2)th gate lines, a data signal of a negative polarity may be applied to the odd-numbered data lines $DL_{2n-1}$, $DL_{2n+1}$, $DL_{2n+3}$, ..., and a data signal of a positive (+) polarity may be applied to the even-numbered data lines $DL_{2n}$, $DL_{2n+2}$, ....

Also, at the even-numbered frame, when a gate-on signal is applied to the (4p+3)th and (4p+4)th gate lines, a data signal of a positive (+) polarity may be applied to the odd-numbered data lines $DL_{2n-1}$, $DL_{2n+1}$, $DL_{2n+3}$, ..., and a data signal of a negative (−) polarity may be applied to the even-numbered data lines $DL_{2n}$, $DL_{2n+2}$, .... In this case, p is an integer greater than or equal to 0.

As a result, as shown in FIGS. 8A and 8B, a two-dot inversion type liquid crystal driving may be performed.

For example, the display panel 110 having a structure of the pixel P shown in FIG. 3 may be driven in a two-dot inversion type as shown in FIGS. 8A and 8B.

According to another embodiment of the present disclosure, at the odd-numbered frame, the odd-numbered pixels P on the (4p+1) and (4p+2)th gate lines and the even-numbered pixels P on the (4p+3) and (4p+4)th gate lines may be charged with a pixel data signal of a positive (+) polarity, and the even-numbered pixels P on the (4p+1) and (4p+2)th gate lines and the odd-numbered pixels P on the (4P+3)th and (4P+4)th gate lines may be charged with a pixel data signal of a negative (−) polarity. Also, at the even-numbered frame, the odd-numbered pixels P on the (4p+1) and (4p+2)th gate lines and the even-numbered pixels P on the (4P+3)th and (4P+4)th gate lines may be charged with a pixel data signal of a negative (−) polarity, and the even-numbered pixels P on the (4p+1) and (4p+2)th gate lines and the odd-numbered pixels P on the (4P+3)th and (4P+4)th gate lines may be charged with a pixel data signal of a positive (+) polarity.

Figure 9:
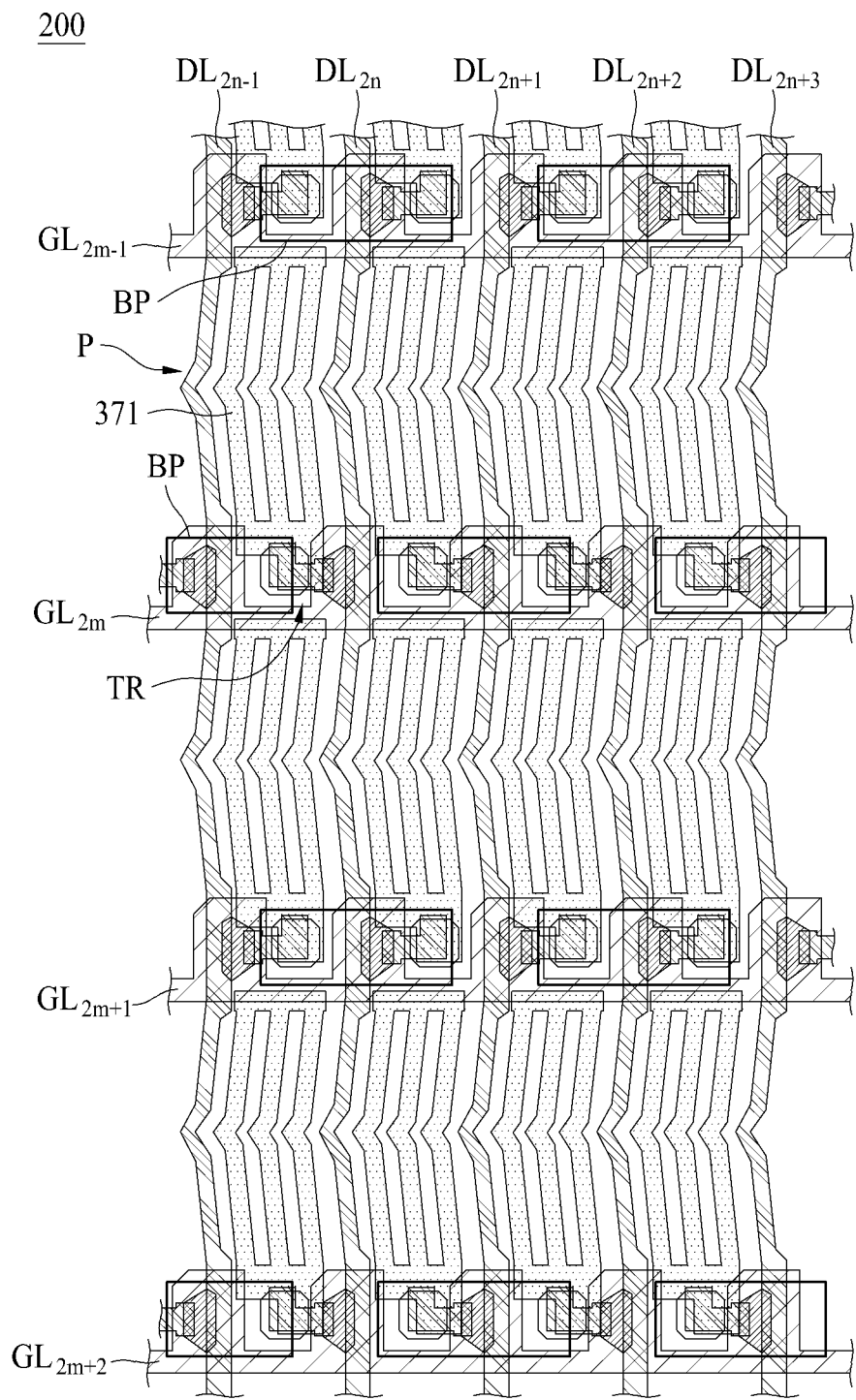
FIG. 9 is a plan view illustrating pixels of a display apparatus according to another embodiment of the present disclosure.

FIG. 9 is a plan view illustrating pixels P of a display apparatus 200 according to another embodiment of the present disclosure. Referring to FIG. 9, in the odd-numbered gate lines $GL_{2m-1}$, $GL_{2m+1}$, ..., the data lines $DL_{2n-1}$, $DL_{2n}$, $DL_{2n+1}$, ... may supply a data signal to a right pixel, and in the even-numbered gate lines $GL_{2m}$, $GL_{2m+2}$, ..., the data lines $DL_{2n-1}$, $DL_{2n}$, $DL_{2n+1}$, may supply a data signal to a left pixel.

The bump BP is disposed on the active layer A of the thin film transistor TR by crossing the data lines DL and the gate line GL.

In more detail, referring to FIG. 9, in order to prevent or at least reduce flicker from occurring and at the same time facilitate dispersion of liquid crystals, there are active layers A that do not overlap the bump BP along one gate line GL, and two or more active layers A that do not overlap the bump BP along one gate line GL are not continuous. In addition, there are active layers A that do not overlap the bump BP along one data line DL, and two or more active layers A that do not overlap the bump BP along one data line DL are not continuous.

According to another embodiment of the present disclosure, the bump BP is alternately arranged for each line of the pixel (zig-zag arrangement) so that the thin film transistor TR, of which driving characteristics are changed due to light generated by the backlight unit 210, and the thin film transistor TR, of which driving characteristics are not changed due to light generated by the backlight unit 210, are uniformly distributed on the display panel 110. As a result, occurrence of flicker may be reduced.

Figure 10:
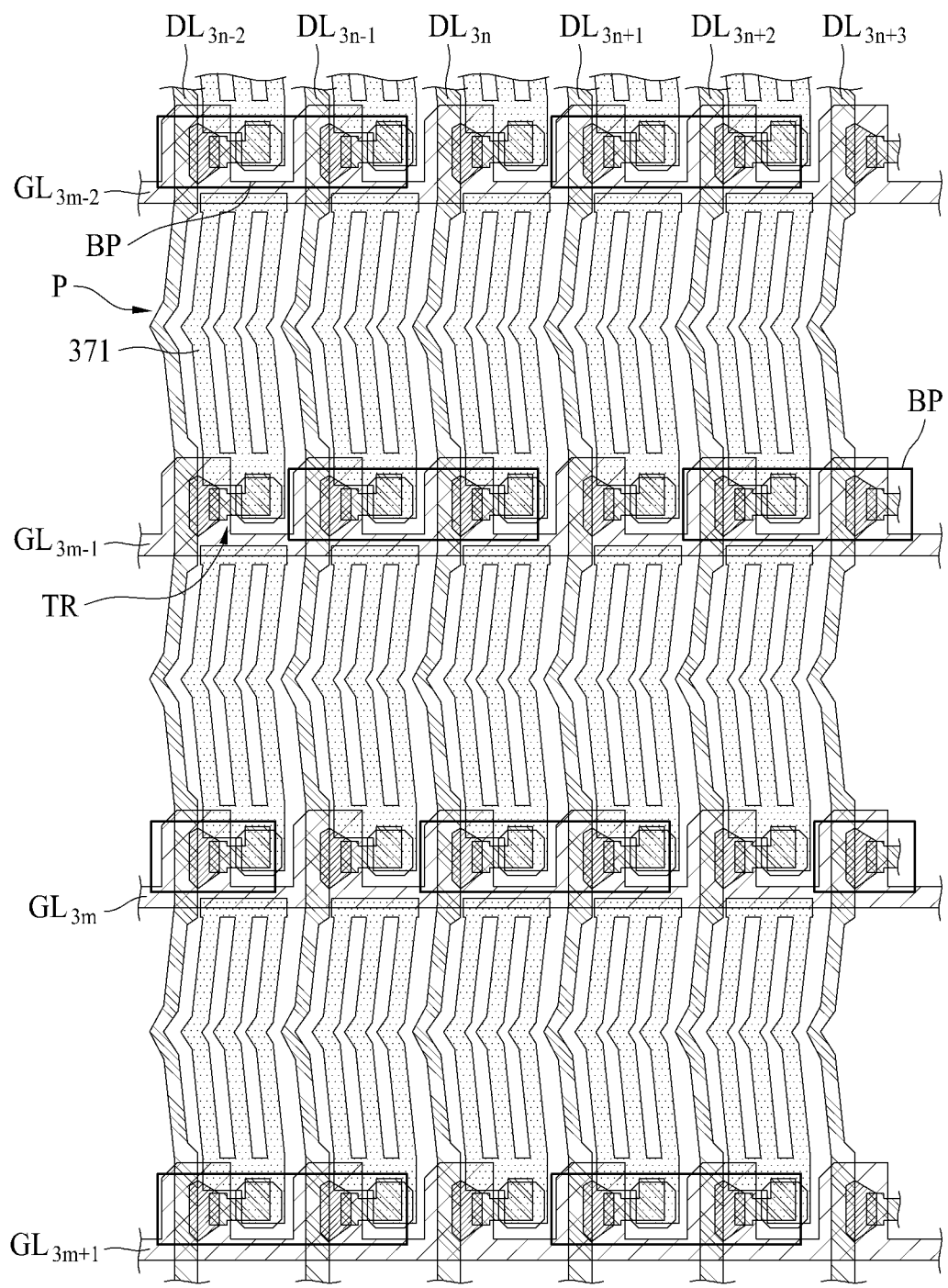
FIG. 10 is a plan view illustrating pixels of a display apparatus according to still another embodiment of the present disclosure.

FIG. 10 is a plan view illustrating pixels P of a display apparatus 300 according to still another embodiment of the present disclosure.

Referring to FIG. 10, in a (3m−2)th gate line $GL_{3m-2}$, the bump BP is disposed on the active layer A of the thin film transistors TR connected to a (3n−2)th data line $DL_{3n-2}$ and a (3n−1)th data line $DL_{3n-1}$, and the bump BP is not disposed on the active layer A of the thin film transistor TR connected to a (3n)th data line $DL_{3n}$.

In a (3m−1)th gate line $GL_{3m-1}$, the bump BP is disposed on the active layer A of the thin film transistors TR connected to the (3n−1)th data line $DL_{3n-1}$ and the (3n)th data line $DL_{3n}$, and the bump BP is not disposed on the active layer A of the thin film transistor TR connected to the (3n−2)th data line $DL_{3n-2}$.

In a (3m)th gate line $GL_{3m}$, the bump BP is disposed on the active layer A of the thin film transistors TR connected to the (3n−2)th data line $DL_{3n-2}$ and the (3n)th data line $DL_{3n}$, and the bump BP is not disposed on the active layer A of the thin film transistor TR connected to the (3n−1)th data line $DL_{3n-1}$. In this case, m and n are natural numbers, respectively.

According to one embodiment of the present disclosure, as shown in FIG. 10, at least one of the plurality of bumps BP may overlap two or more active layers A disposed continuously along the gate line GL.

Also, referring to FIG. 10, the active layers A that overlap the bump BP along one gate line GL may be configured such that three or more may not be continuous.

Also, referring to FIG. 10, the active layers A that overlap the bump BP along one data line DL may be configured such that three or more may not be continuous.

According to another embodiment of the present disclosure, in order to prevent or at least reduce flicker from occurring and at the same time facilitate dispersion of liquid crystals, the bump BP is not disposed on one of three active layers A disposed continuously along one gate line GL, and active layers A that do not overlap the bump BP along one gate line GL are not continuously disposed. In addition, the bump BP is not disposed on one of the three active layers A disposed continuously along one data line DL, and active layer A that do not overlap the bump BP along one data line DL are not continuously disposed.

The pixels P of the display apparatus 300 shown in FIG. 10 may be driven in a column inversion type as shown in FIGS. 7A and 7B, or may be driven in a two-dot inversion type as shown in FIGS. 8A and 8B.

Figure 11:
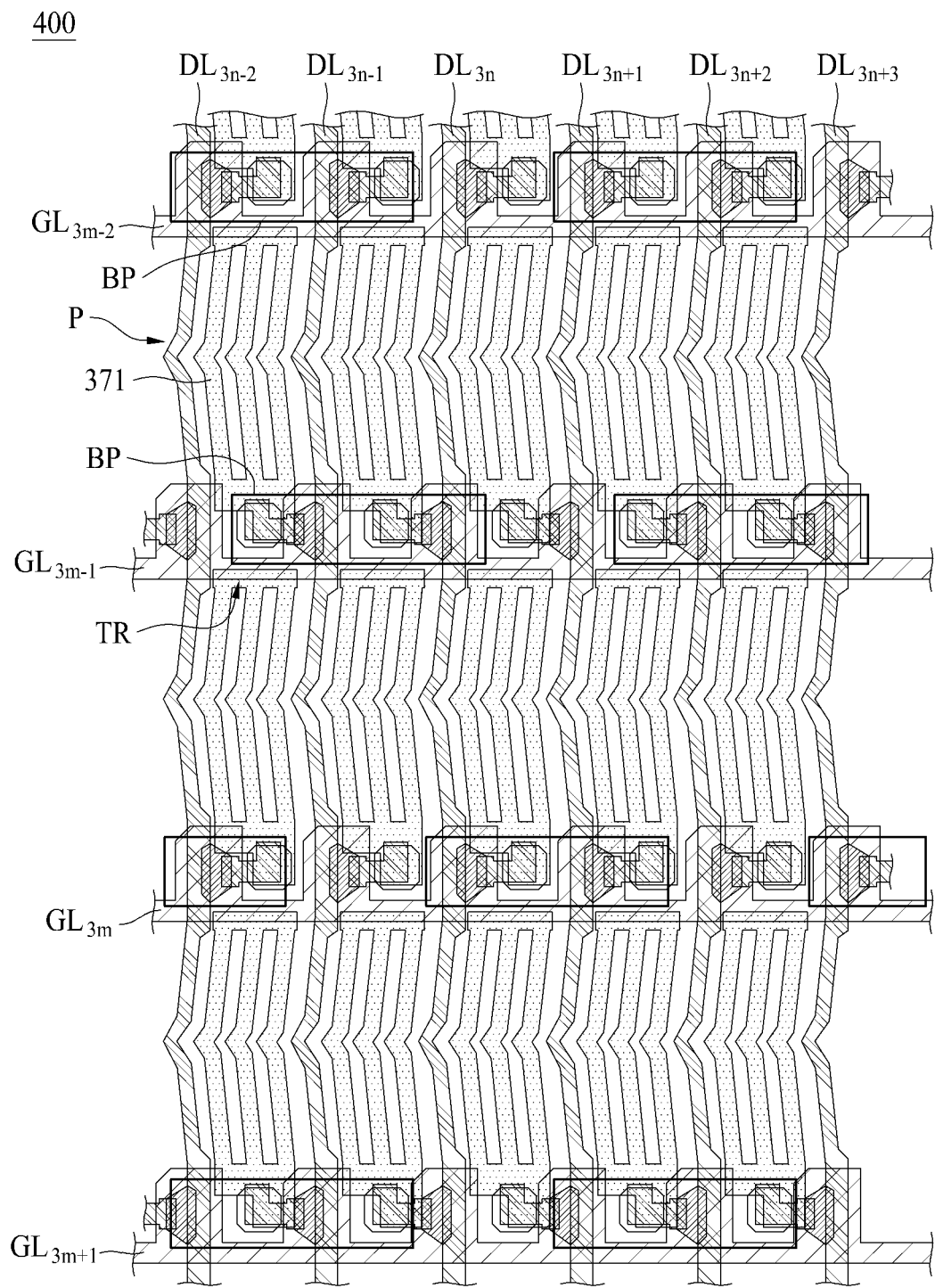
FIG. 11 is a plan view illustrating pixels of a display apparatus according to further still another embodiment of the present disclosure.

FIG. 11 is a plan view illustrating pixels P of a display apparatus 400 according to further still another embodiment of the present disclosure. Referring to FIG. 11, in an odd-numbered gate line, a data line may supply a data signal to a right pixel, and in an even-numbered gate line, a data line may supply a data signal to a left pixel.

The bump BP is disposed on the active layer A of the thin film transistor TR by crossing the data lines DL and the gate line GL.

Referring to FIG. 11, in order to reduce flicker from occurring and at the same time facilitate dispersion of liquid crystals, the bump BP is not disposed on one of three active layers A disposed continuously along one gate line GL, and active layers A that do not overlap the bump BP along one gate line GL are not continuously disposed. In addition, the bump BP is not disposed on one of the three active layers A disposed continuously along one data line DL, and active layers A that do not overlap the bump BP along one data line DL are not continuously disposed.

According to the present disclosure, the following advantageous effects may be obtained.

According to one embodiment of the present disclosure, the position of the bump may be adjusted, whereby a flicker phenomenon may be prevented or at least reduced from occurring in the display apparatus.

According to one embodiment of the present disclosure, the bump is alternately disposed along the gate line and the data line. Therefore, performance deviation of the thin film transistor is uniform over the entire display panel, whereby the flicker phenomenon may be suppressed in the display apparatus.

According to one embodiment of the present disclosure, as the bump is disposed alternately along the gate line and the data line over the entire display panel, performance distribution of the thin film transistor is uniform, and a transmittance difference between two polarities is reduced in the process of inverting the charging polarity in the pixel, whereby occurrence of the flicker may be suppressed.

It will be apparent to those skilled in the art that the present disclosure described above is not limited by the above-described embodiments and the accompanying drawings and that various substitutions, modifications and variations may be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:
1. A display apparatus comprising:
a plurality of data lines;
a plurality of gate lines, each of the plurality of gate lines crossing at least one of the plurality of data lines;
a plurality of thin film transistors, each of the plurality of thin film transistors electrically connected to at least one of the plurality of data lines and at least one of the plurality of gate lines, and each of the plurality of thin film transistors includes an active layer, wherein a first plurality of active layers are disposed along a gate line from the plurality of gate lines; and
a plurality of bumps disposed on at least some of the plurality of thin film transistors, the plurality of bumps including a first plurality of bumps and a second plurality of bumps;
wherein each of the first plurality of bumps overlaps at least one of the first plurality of active layers, but a portion of the first plurality of active layers disposed along the gate line is not overlapped by any of the first plurality of bumps, and two or more active layers from the portion of the first plurality of active layers that are not overlapped by any of the first plurality of bumps are not continuously disposed along the gate line,
wherein a second plurality of active layers are disposed along a data line from the plurality of data lines, but a portion of the second plurality of active layers disposed along the data line is not overlapped by any of the second plurality of bumps, and two or more active layers from the portion of the second plurality of active layers that are not overlapped by any of the second plurality of bumps are not continuously disposed along the data line.

2. The display apparatus of claim 1, wherein two or more active layers from the first plurality of active layers that overlap bumps from the first plurality of bumps are alternately disposed along the gate line.

3. The display apparatus of claim 1, wherein two or more active layers from the second plurality of active layers that overlap bumps from the second plurality of bumps are alternately disposed along the data line.

4. The display apparatus of claim 1, wherein at least one of the first plurality of bumps overlaps two or more active layers from the first plurality of active layers, the two or more active layers continuously disposed along the gate line.

5. The display apparatus of claim 1, wherein three or more active layers from the first plurality of active layers that overlap bumps from the first plurality of bumps are not continuously disposed along the gate line.

6. The display apparatus of claim 1, wherein three or more active layers from the second plurality of active layers that overlap bumps from the second plurality of bumps are not continuously disposed along the data line.

7. The display apparatus of claim 1, wherein the active layer includes at least one of an amorphous silicon semiconductor material, a crystalline silicon semiconductor material, or an oxide semiconductor material.

8. The display apparatus of claim 1, wherein the thin film transistor further includes:
a gate electrode spaced apart from the active layer included in the thin film transistor;
a source electrode connected to the active layer; and
a drain electrode spaced apart from the source electrode, the drain electrode connected to the active layer.

9. The display apparatus of claim 1, further comprising:
a black matrix, wherein at least one of the first plurality of bumps and the second plurality of bumps overlaps the black matrix.

10. The display apparatus of claim 1, further comprising:
a column spacer disposed on at least a portion of the plurality of bumps.

11. The display apparatus of claim 1, further comprising:
a first electrode connected to a thin film transistor from the plurality of thin film transistors; and
a liquid crystal layer on the first electrode.

12. The display apparatus of claim 1, wherein an odd-numbered data line from the plurality of data lines is applied a data signal of a positive polarity during an odd-numbered frame, and an even-numbered data line from the plurality of data lines is applied a data signal of a negative polarity during the odd-numbered frame, and
wherein the odd-numbered data line is applied the data signal of the negative polarity during the even-numbered frame, and the even-numbered data line is applied the data signal of the positive polarity during the even-numbered frame.

13. The display apparatus of claim 1, wherein, during an odd-numbered frame, responsive to a gate-on signal being applied to a (4p+1)th gate line and a (4p+2)th gate line, a data signal having a positive polarity is applied to an odd-numbered data line from the plurality of data lines, and a data signal of a negative polarity is applied to an even-numbered data line from the plurality of data lines,
wherein during the odd-numbered frame, responsive to the gate-on signal being applied to a (4p+3)th gate line and a (4p+4)th gate line, a data signal of the negative polarity is applied to the odd-numbered data line and a data signal of the positive polarity is applied to the even-numbered data line,
wherein during an even-numbered frame, responsive to the gate-on signal being applied to the (4p+1)th gate line and the (4p+2)th gate line, the data signal of the negative polarity is applied to the odd-numbered data line, and the data signal of the positive polarity is applied to the even-numbered data line,
wherein during the even-numbered frame, responsive to the gate-on signal being applied to the (4p+3)th gate line and the (4p+4)th gate line, the data signal of the positive polarity is applied to the odd-numbered data line and the data signal of the negative polarity is applied to the even-numbered data line, and
p is an integer greater than or equal to 0.

14. A display apparatus comprising:
a first substrate;
a plurality of data lines on the first substrate;
a plurality of gate lines on the first substrate, each of the plurality of gate lines crossing at least one of the plurality of data lines;
a first thin film transistor connected to one of the plurality of data lines and one of the plurality of gate lines, the first thin film transistor including an active layer, a gate electrode spaced apart from the active layer, a source electrode connected to the active layer, and a drain electrode connected to the active layer;
a first electrode connected to the first thin film transistor;
a second electrode insulated from the first electrode;
a liquid crystal layer on the first electrode; and
a bump disposed on the first electrode, the bump overlapping the active layer of the thin film transistor,
wherein the bump partially overlaps a second thin film transistor that is adjacent to the first thin film transistor without overlapping an active layer of the second thin film transistor, wherein the first thin film transistor and the second thin film transistor are connected to a same gate line from the plurality of gate lines and adjacent to each other along the same gate line without a third thin film transistor disposed between the first thin film transistor and the second thin film transistor.

15. The display apparatus of claim 14, wherein the first electrode is connected to the first thin film transistor via a contact hole, the first electrode partially filing the contact hole and a portion of the bump filing a remaining portion of the contact hole.

16. The display apparatus of claim 14, wherein the second electrode is disposed between the first thin film transistor and the bump.

17. The display apparatus of claim 14, further comprising:
a column spacer having a first end in direct contact with the bump and a second end on a second substrate.

18. The display apparatus of claim 13, wherein the display apparatus is driven using a column inversion method or a two-dot inversion method.

* * * * *